(12) United States Patent
Cho et al.

(10) Patent No.: US 10,204,935 B2
(45) Date of Patent: Feb. 12, 2019

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventors: Hyun Jin Cho, Yongin-si (KR); Joon-Hwa Bae, Yongin-si (KR); Byoung Kwon Choo, Yongin-si (KR); Byung Hoon Kang, Yongin-si (KR); Kwang Suk Kim, Yongin-si (KR); Woo Jin Cho, Yongin-si (KR); Jun Hyuk Cheon, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/702,797

(22) Filed: Sep. 13, 2017

(65) Prior Publication Data

US 2018/0108684 A1   Apr. 19, 2018

(30) Foreign Application Priority Data

Oct. 18, 2016   (KR) .......................... 10-2016-0135041

(51) Int. Cl.
*H01L 27/12* (2006.01)
*B24B 31/00* (2006.01)
(Continued)

(52) U.S. Cl.
CPC .......... *H01L 27/1248* (2013.01); *B24B 31/00* (2013.01); *C09G 1/02* (2013.01); *H01L 21/31053* (2013.01); *H01L 22/26* (2013.01); *H01L 27/1244* (2013.01); *H01L 27/1255* (2013.01); *H01L 27/1262* (2013.01);
(Continued)

(58) Field of Classification Search
CPC ............. H01L 27/1248; H01L 27/1262; H01L 27/1255; H01L 21/31053; H01L 22/26; H01L 27/1244; H01L 21/0217; H01L 21/02164; H01L 27/3258; H01L 27/3262; H01L 27/3265; H01L 27/3276; H01L 2227/323; H01L 29/78675; C09G 1/02; G09G 3/3233; B24B 31/00
See application file for complete search history.

(56) References Cited

U.S. PATENT DOCUMENTS

2002/0064959 A1   5/2002 Chien et al.
2015/0255523 A1*  9/2015 Her ..................... H01L 27/3262
                                                         345/76
(Continued)

FOREIGN PATENT DOCUMENTS

KR   10-2013-0142679 A   12/2013

*Primary Examiner* — Selim Ahmed
(74) *Attorney, Agent, or Firm* — Lee & Morse, P.C.

(57) ABSTRACT

A method for manufacturing a display device includes forming a first gate metal wire on a substrate, forming a first insulation layer that covers the first gate metal wire, forming a second gate metal wire on the first insulation layer, forming a second main insulation layer that covers the second gate metal wire, forming a second auxiliary insulation layer on the second main insulation layer, forming an exposed portion of an upper surface of the second main insulation layer by polishing the second auxiliary insulation layer, and forming a first data metal wire on the second main insulation layer and the second auxiliary insulation layer.

8 Claims, 6 Drawing Sheets

(51) Int. Cl.
*C09G 1/02* (2006.01)
*H01L 21/3105* (2006.01)
*H01L 21/66* (2006.01)
*G09G 3/3233* (2016.01)
*H01L 21/02* (2006.01)
*H01L 27/32* (2006.01)
*H01L 29/786* (2006.01)

(52) U.S. Cl.
CPC ........ *G09G 3/3233* (2013.01); *H01L 21/0217* (2013.01); *H01L 21/02164* (2013.01); *H01L 27/3258* (2013.01); *H01L 27/3262* (2013.01); *H01L 27/3265* (2013.01); *H01L 27/3276* (2013.01); *H01L 29/78675* (2013.01); *H01L 2227/323* (2013.01)

(56) References Cited

U.S. PATENT DOCUMENTS

2016/0148986 A1* 5/2016 Lee .................... H01L 27/3262
  345/694
2017/0207288 A1* 7/2017 Kang .................... H01L 27/326

* cited by examiner

DISPLAY DEVICE AND MANUFACTURING METHOD THEREOF

CROSS-REFERENCE TO RELATED APPLICATION

Korean Patent Application No. 10-2016-0135041 filed on Oct. 18, 2016, in the Korean Intellectual Property Office, and entitled: "Display Device and Manufacturing Method Thereof," is incorporated by reference herein in its entirety.

BACKGROUND

1. Field

Embodiments relate to a display device and a manufacturing method thereof.

2. Description of the Related Art

Display devices include a liquid crystal display (LCD), a plasma display panel (PDP), an organic light emitting diode (OLED) display, a field emission display (FED), and an electrophoretic display device. Generally, in the display device, the plurality of transistors and one or more capacitors are included in one pixel.

The above information disclosed in this Background section is only for enhancement of understanding of the background of the invention and therefore it may contain information that does not form the prior art that is already known in this country to a person of ordinary skill in the art.

SUMMARY

Embodiments are directed to a method for manufacturing a display device, the method including forming a first gate metal wire on a substrate, forming a first insulation layer that covers the first gate metal wire, forming a second gate metal wire on the first insulation layer, forming a second main insulation layer that covers the second gate metal wire, forming a second auxiliary insulation layer on the second main insulation layer, forming an exposed portion of an upper surface of the second main insulation layer by polishing the second auxiliary insulation layer, and forming a first data metal wire on the second main insulation layer and the second auxiliary insulation layer. An upper surface of the second auxiliary insulation layer may be formed on the same horizontal plane as the exposed portion of the upper surface of the second main insulation layer, and the uppermost layer of the second main insulation layer may include a silicon nitride, and the second auxiliary insulation layer may include a silicon oxide.

Forming the exposed portion of the upper surface of the second main insulation layer by polishing the second auxiliary insulation layer may include coating a first slurry on a surface of the second auxiliary insulation layer, and the first slurry may include first abrasives that polish the second auxiliary insulation layer and may include a first polishing inhibitor that inhibits the polishing of the second main insulation layer.

A thickness of the second auxiliary insulation layer may be greater than a step of the upper surface of the second main insulation layer, the step of the upper surface of the second main insulation layer being a gap between a first portion of the upper surface of the second main insulation layer having a highest height and a second portion of the upper surface of the second main insulation layer having a lowest height.

The method may further include forming a third main insulation layer that covers the first data metal wire, forming a third auxiliary insulation layer on the third main insulation layer, forming an exposed portion of an upper surface of the third main insulation layer by polishing the third auxiliary insulation layer, and forming a second data metal wire on the third main insulation layer and the third auxiliary insulation layer. An upper surface of the third auxiliary insulation layer may be disposed on the same horizontal plane as the exposed portion of the upper surface of the third main insulation layer.

The polishing of the third auxiliary insulation layer may include coating a second slurry on a surface of the third auxiliary insulation layer, and the second slurry may include second abrasives that polish the third auxiliary insulation layer and may include a second polishing inhibitor that inhibits the polishing of the third main insulation layer.

The third main insulation layer may include a silicon nitride.

A thickness of the third auxiliary insulation layer may be greater than a step of the upper surface of the third main insulation layer, the step of the upper surface of the third main insulation layer being a gap between a third portion of the upper surface of the third main insulation layer having a highest height, and a fourth portion of the third main insulation layer having a lowest height.

Forming the exposed portion of the upper surface of the second main insulation layer may include polishing using a polishing device that includes a polishing portion that polishes a target object while being rotated, and a polishing control portion that controls a rotation speed of the polishing portion by measuring a change in a frictional force of the polishing portion, and forming the exposed portion of the upper surface of the second main insulation layer by polishing the second auxiliary insulation layer may include measuring the change in the frictional force of the polishing portion by sensing the rotation speed of the polishing portion by the polishing control portion, and stopping rotation of the polishing portion at the time that the frictional force is changed by the polishing control portion.

Embodiments are also directed to a display device, including a substrate, a first gate metal wire that is disposed on the substrate, a first insulation layer that covers the first gate metal wire, a second gate metal wire that is disposed on the first insulation layer, a second main insulation layer that covers the second gate metal wire, a second auxiliary insulation layer that is disposed on the second main insulation layer, and a first data metal wire that is disposed on the second main insulation layer and the second auxiliary insulation layer. An upper surface of the second auxiliary insulation layer may be disposed on the same horizontal plane as a part of an upper surface of the second main insulation layer, the uppermost layer of the second main insulation layer may include a silicon nitride, and the second auxiliary insulation layer may include a silicon oxide.

The display device may further include a third main insulation layer that covers the first data metal wire, a third auxiliary insulation layer that is disposed on the third main insulation layer, and a second data metal wire that is disposed on the third main insulation layer and the third auxiliary insulation layer. An upper surface of the third auxiliary insulation layer may be disposed on the same horizontal plane as a part of an upper surface of the third main insulation layer, and the third main insulation layer may include a silicon nitride.

A part of the upper surface of the third main insulation layer that is disposed between the first data metal wire and the second data metal wire may directly contact the second metal wire.

A thickness of the third main insulation layer may be smaller than a thickness of the second main insulation layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
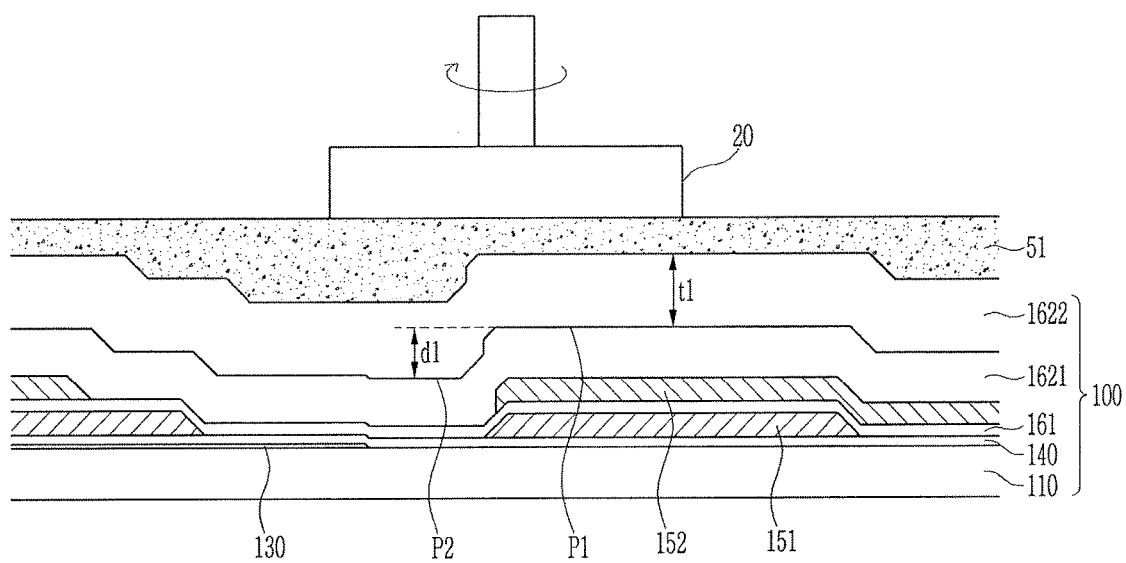
FIG. 1 illustrates a cross-sectional view of a method for manufacturing a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

In the specification, unless explicitly described to the contrary, the word "comprise" and variations such as "comprises" or "comprising" will be understood to imply the further inclusion of other elements. In addition, in the specification, it will be understood that when an element such as a layer, a film, a region, or a substrate is referred to as being "over" or "on" another element, it can be "directly on" the other element or intervening elements may also be present. Further, the word "over" or "on" means positioning on or below the object portion, but does not essentially mean positioning on the upper side of the object portion based on a gravity direction.

In this specification, the phrase "on a plane" means viewing a target portion from the top, and the phrase "on a cross-section" means viewing a cross-section formed by vertically cutting a target portion from the side.

A display device may include the plurality of transistors and one or more capacitors in one pixel, and a separate wire may be further formed or an existing wire may be omitted, so that the display device may also be formed to have various structures. Here, the pixel refers to a minimum unit displaying an image, and the display device displays an image through the plurality of pixels.

Hereinafter, a manufacturing method of a display device according to an example embodiment will be described with reference to FIG. 1 to FIG. 6.

Figure 2:
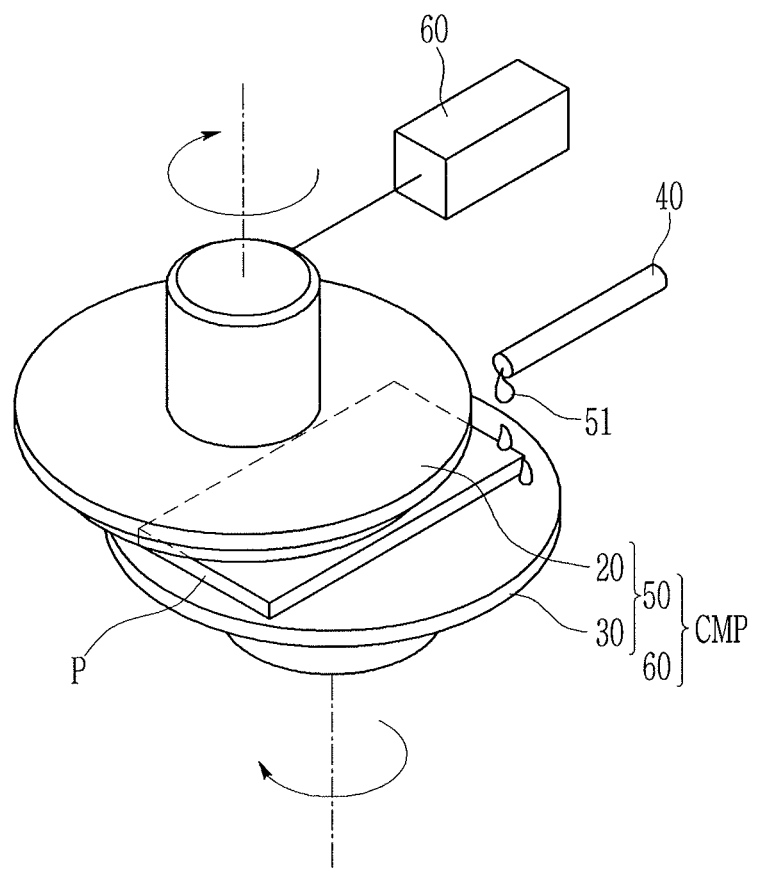
FIG. 2 illustrates a schematic perspective view of a polishing device used in the method for manufacturing the display device according to an example embodiment.
Figure 3:
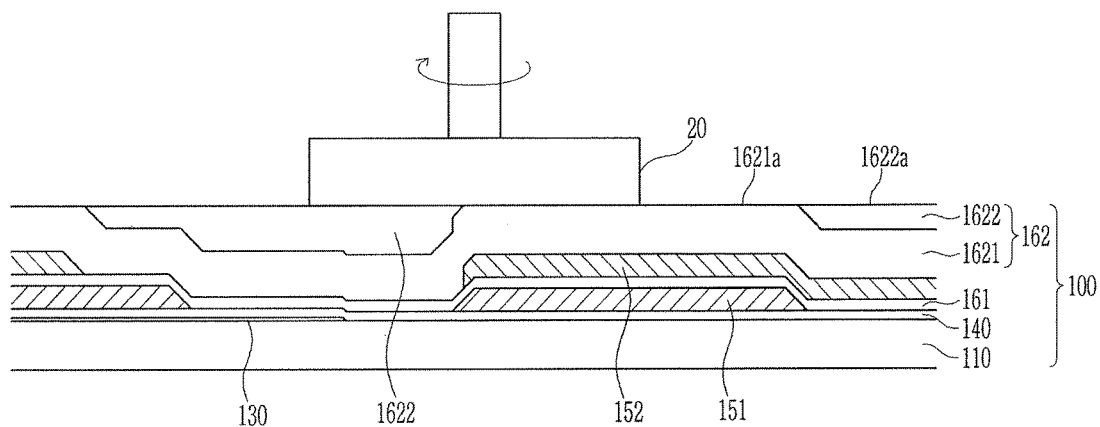
FIG. 3 illustrates the next stage after that of FIG. 1.
Figure 4:
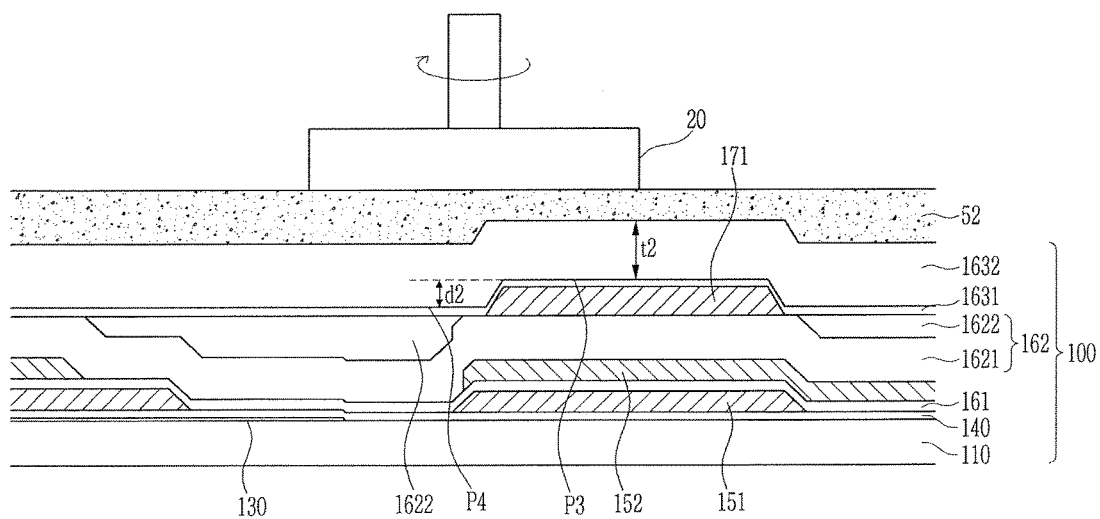
FIG. 4 illustrates the next stage after that of FIG. 3.
Figure 5:
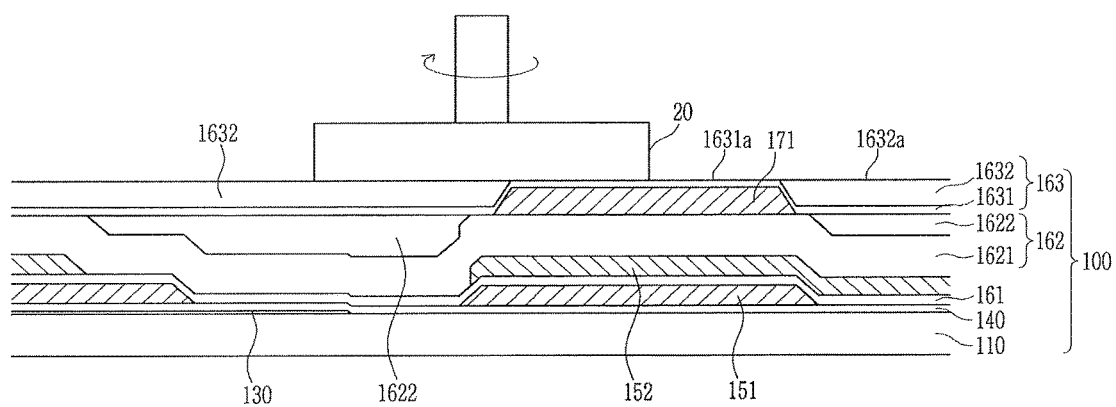
FIG. 5 illustrates the next stage after that of FIG. 4.
Figure 6:
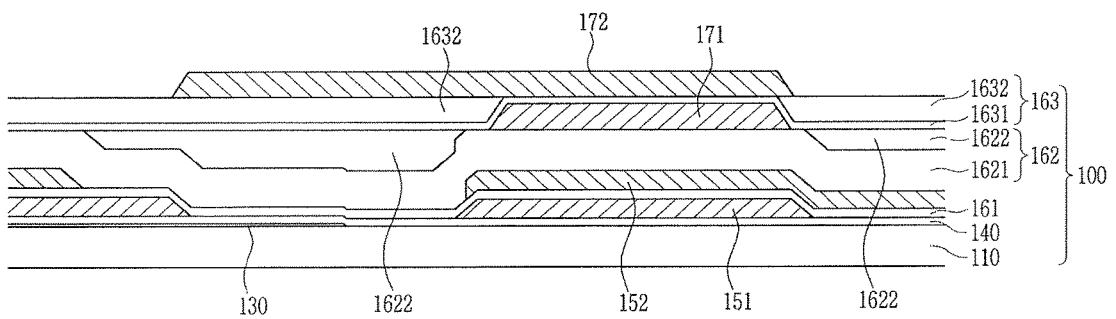
FIG. 6 illustrates the next stage after that of FIG. 5.

FIG. 1 is a cross-sectional view that shows one stage of a manufacturing method of a display device according to an example embodiment, FIG. 2 is a schematic perspective view of a polishing device used in the manufacturing method of the display device according to an example embodiment, and FIG. 3 shows the next stage after that of FIG. 1. FIG. 4 shows the next stage after that of FIG. 3, FIG. 5 shows the next stage after that of FIG. 4, and FIG. 6 shows the next stage after that of FIG. 5.

As shown in FIG. 1, an active layer 130 is provided on a substrate 110, and a gate insulation layer 140 that covers the active layer 130 is provided on the active layer 130. The active layer 130 may be formed by, for example, forming an amorphous silicon layer and then crystallizing the amorphous silicon layer using a laser crystallization process. The amorphous silicon layer may be formed using, for example, a low pressure chemical vapor deposition method, a normal pressure chemical vapor deposition method, a plasma enhanced chemical vapor deposition method, a sputtering method, a vacuum evaporation method, and the like. The gate insulation layer 140 may include, for example, a silicon oxide ($SiO_x$) or a silicon nitride ($SiN_x$).

A first gate metal wire 151 may be formed on the gate insulation layer 140. The first gate metal wire 151 may include, for example, one or more of molybdenum (Mo), a molybdenum alloy, copper (Cu), a copper alloy, aluminum (Al), an aluminum alloy, etc.

A first insulation layer 161 may cover the first gate metal wire 151. The first insulation layer 161 may include, for example, a silicon oxide ($SiO_x$) or a silicon nitride ($SiN_x$).

A second gate metal wire 152 may be on the first insulation layer 161. The second gate metal wire 152 may include, for example, one or more of molybdenum (Mo), a molybdenum alloy, copper (Cu), a copper alloy, aluminum (Al), or an aluminum alloy, etc.

A second main insulation layer 1621 may cover the second gate metal wire 152. The second main insulation layer 1621 may be provided as a double layer of a lower layer and an upper layer. In this case, the lower layer may include, for example, a silicon oxide, and the upper layer may include, for example, a silicon nitride. In an implementation, the second main insulation layer 1621 may be provided as a plurality of various layers in which the uppermost layer of the second main insulation layer 1621 includes a silicon nitride.

A second auxiliary insulation layer 1622 may be on the second main insulation layer 1621. The second auxiliary insulation layer 1622 may include, for example, a silicon oxide.

In an implementation, a thickness t1 of the deposited second auxiliary insulation layer 1622 may be greater than a step d1 of an upper surface of the second main insulation layer 1621. Here, the step d1 of the upper surface of the second main insulation layer 1621 may be a distance between a first portion P having the maximum height and a second portion P2 having the minimum height in the upper surface. Here, a height of the first portion P1 or a height of the second portion P2 is defined as a shortest distance from an upper surface of the substrate 110 to an upper surface of the first portion or an upper surface of the second portion P2.

As shown in FIG. 1, a polishing process may be performed, for example, by using a polishing device that performs a chemical mechanical polishing process.

Referring to FIG. 2, a detailed structure of an example of the polishing device will be described in detail.

As shown in FIG. 2, a polishing part CMP may include, for example, a polishing portion 50 that polishes a target object P by being rotated, and a polish control portion 60 that controls a rotation speed of the polishing portion 50 by measuring a change in a frictional force. The polishing portion 50 may includes a first polishing portion 20 and a second polishing portion 30 that face each other. The target object P may be placed on the second polishing portion 30. The first polishing portion 20 and the second polishing portion 30 may rotate to polish the target object P that is placed therebetween. A first slurry 51 may be supplied to the surface of the target object P by using a nozzle 40. The first slurry 51 may be a material for easily polishing the target object P.

The target object P shown in FIG. 2 corresponds to a display device 100 shown in FIG. 1 and FIG. 3 to FIG. 5. FIG. 1 and FIG. 3 to FIG. 5 only illustrate the first polishing portion 20 for better understanding and ease of description.

In the present example embodiment, the display device 100 is attached on the second polishing portion 30 and the polishing process is performed, but this is not restrictive. The display device 100 may be disposed below the first polishing portion 20 and the polishing process may be performed according to another example embodiment.

As shown in FIG. 1, the first slurry 51 is coated on the surface of the second auxiliary insulation layer 1622. The first slurry 51 may include, for example, first abrasives that polish the second auxiliary insulation layer 1622, a first polishing inhibitor that inhibits the polishing of the second main insulation layer 1621, a dispersant that disperses the first abrasives, a dispersion stabilizer that helps maintain dispersion of the first abrasives, and a pH regulator. The first abrasives may include, for example, silica ($SiO_2$), ceria ($CeO_2$), alumina ($Al_2O_3$), zirconia ($ZrO_2$), tin oxide ($SnO_2$), manganese oxide ($MnO_2$), and the like. The first polishing inhibitor may include, for example, polyacrylic acid.

The second auxiliary insulation layer 1622 where the first slurry 51 is coated may be polished by rotating the first polishing portion 20 of the polishing device CMP. The first abrasives included in the first slurry 51 helps the first polishing portion 20 to more easily polish the second auxiliary insulation layer 1622.

Next, as shown in FIG. 3, the second auxiliary insulation layer 1622 may be continuously polished using the polishing device CMP to partially expose an upper surface 1621a of the second main insulation layer 1621. The operation of the polishing device CMP may be stopped when the upper surface 1621a of the second main insulation layer 1621 is partially exposed. The first polishing inhibitor included in the first slurry 51 inhibits the polishing of the second main insulation layer 1621 exposed to the first polishing inhibitor, and, when sensing a change in frictional force, the polishing control portion 60 stops the rotation of the polishing portion 50. In this case, an upper surface 1622a of the second auxiliary insulation layer 1622 is disposed on the same horizontal plane as the exposed upper surface 1621a of the second main insulation layer 1621. Through such a polishing process, a second insulation layer 162 of which the upper surface is planarized is formed. The second insulation layer 162 includes the second main insulation layer 1621 and the second auxiliary insulation layer 1622.

Next, as shown in FIG. 4, a first data metal wire 171 is formed on the second insulation layer 162 that includes the second main insulation layer 1621 and the second auxiliary insulation layer 1622, a third main insulation layer 1631 and a third auxiliary insulation layer 1632 are formed on the first data metal wire 171, a second slurry 52 is coated on the third auxiliary insulation layer 1632, and then the third auxiliary insulation layer 1632 where the second slurry 52 is coated is polished by rotating the first polishing portion 20 of the polishing device CMP. This is described in further detail below.

The data metal wire 171 may be formed in multiple layers, for example, in which metal layers including any one of aluminum (Al), an aluminum alloy, molybdenum (Mo), a molybdenum alloy, copper (Cu), and a copper alloy are laminated, and for example, may be formed of triple layers of titanium/aluminum/titanium (Ti/Al/Ti), triple layers of molybdenum/aluminum/molybdenum (Mo/Al/Mo), or triple layers of molybdenum/copper/molybdenum (Mo/Cu/Mo). The second insulation layer 162 may be planarized before the first data metal wire 171 is formed, and accordingly, the first data metal wire 171 disposed on the second insulation layer 162 may be formed without a step. Accordingly, the first data metal wire 171 may be easily patterned, for example, using lithography.

After the first data metal wire 171 is formed, the third main insulation layer 1631 that covers the first data metal wire 171 may be formed. The third main insulation layer 1631 may include, for example, a silicon nitride.

Then, the third auxiliary insulation layer 1632 may be formed on the third main insulation layer 1631. The third auxiliary insulation layer 1632 may include, for example, a silicon oxide. In this case, a thickness t2 of the deposited third auxiliary insulation layer 1632 may be greater than a step d2 of an upper surface of the third main insulation layer 1631. Here, the step d2 of the upper surface of the third main insulation layer 1631 may be a gap between a third portion P3 that has the highest height in the upper surface of the third main insulation layer 1631 and a fourth portion P4 that has the lowest height in the upper surface of the third main insulation layer 1631. Here, the height of the third portion P3 or the height of the fourth portion P4 are defined as the shortest distance to an upper surface of the third portion P3 or an upper surface of the fourth portion P from the upper surface of the substrate 110.

Second slurry 52 may be coated on a surface of the third auxiliary insulation layer 1632. The second slurry 52 may include, for example, second abrasives that polish the third auxiliary insulation layer 1632, a second abrasives inhibitor that inhibits the polishing of the third main insulation layer 1631, a dispersant that disperses second abrasives, a dispersion stabilizer that helps maintain dispersion of the second abrasives, and a pH regulator. The second abrasives may include, for example, silica ($SiO_2$), ceria ($CeO_2$), alumina ($Al_2O_3$), zirconia ($ZrO_2$), tin oxide ($SnO_2$), manganese oxide ($MnO_2$), and the like. The second polishing inhibitor may include, for example, polyacrylic acid.

The third auxiliary insulation layer 1632 where the second slurry 52 is coated may be polished, for example, by rotating the first polishing portion 20 of the polishing device CMP. The second abrasives included in the second slurry 52 help the first polishing portion 20 to more easily polish the third auxiliary insulation layer 1632.

Next, as shown in FIG. 5, the third auxiliary insulation layer 1632 may be continuously polished by using the polishing device CMP to partially expose an upper surface 1631a of the third main insulation layer 1631. The operation of the polishing device CMP may be stopped when the upper surface 1631a of the third main insulation layer 1631 is partially exposed. The second polishing inhibitor included in the second slurry 53 inhibits the polishing of the third main insulation layer 1631 exposed to the second polishing inhibitor, and, when sensing a change in frictional force, the polishing control portion 60 may stop the rotation of the polishing portion 50. In this case, an upper surface 1632a of the third auxiliary insulation layer 1632 is disposed on the same horizontal plane as the exposed upper surface 1631*a* of the third main insulation layer 1631. Through such a polishing process, a third insulation layer 163 of which the upper surface is planarized is formed. The third insulation layer 163 includes the third main insulation layer 1631 and the third auxiliary insulation layer 1632.

Next, as shown in FIG. 6, a second data metal wire 172 may be formed on the third insulation layer 163 that includes the third main insulation layer 1631 and the third auxiliary insulation layer 1632. The second data metal wire 172 may be formed, for example, in multiple layers, in which metal layers including any one, for example, of aluminum (Al), an aluminum alloy, molybdenum (Mo), a molybdenum alloy, copper (Cu), and a copper alloy are laminated, and for example, may be formed of triple layers of titanium/aluminum/titanium (Ti/Al/Ti), triple layers of molybdenum/aluminum/molybdenum (Mo/Al/Mo), or triple layers of molybdenum/copper/molybdenum (Mo/Cu/Mo).

The second data metal wire 172 may be partially overlapped with the first data metal wire 171. In this case, the third insulation layer 163 may be planarized, and the second data metal wire 172 that is disposed on the third insulation layer 163 may be formed without a step. Accordingly, the second data metal wire 172 may be easily patterned, for example, using lithography.

The third insulation layer 163 that is disposed between the first data metal wire 171 and the second data metal wire 172 may be planarized, and thus the thickness of the third insulation layer 163 can be made thin. Accordingly, capacitance of a capacitor that includes the first data metal wire 171, the second data metal wire 172, and the third main insulation layer 1631 that is disposed between the first data metal wire 171 and the second data metal wire 172 may be maximized.

In addition, the second insulation layer 162 and the third insulation layer 163 may be planarized, and both of the first data metal wire 171 and the second data metal wire 172 may be formed without steps such that a short circuit between the first data metal wire 171 and the second data metal wire 172 may be minimized. Accordingly, a display device having high resolution may be readily manufactured.

Hereinafter, a display device manufactured by using the manufacturing method of the display device according to the above-described example embodiment will be described in detail with reference to FIG. 7 and FIG. 8.

Figure 7:
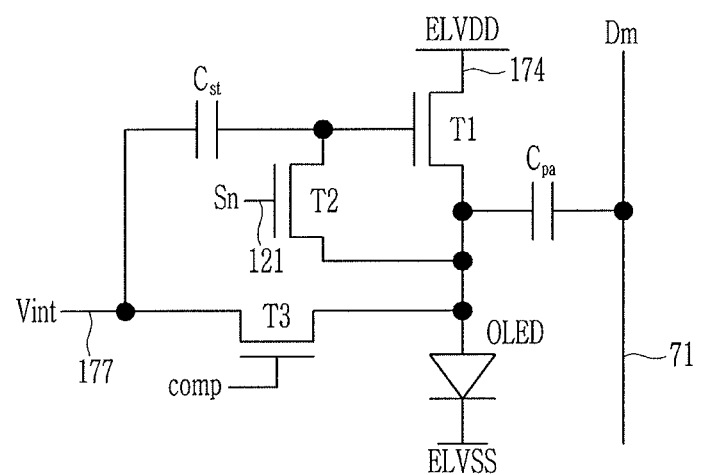
FIG. 7 illustrates an equivalent circuit diagram of a pixel of a display device according to an example embodiment.

FIG. 7 is an equivalent circuit diagram of a pixel of a display according to an example embodiment.

In an example embodiment, as shown in FIG. 7, one pixel of display device may include a driving transistor T1, a switching transistor T2, a compensation transistor T3, a storage capacitor Cst, a parasitic capacitor Cpa, and an organic light emitting diode (OLED). In addition, a scan line 121 that transmits a scan signal Sn, a data line 71 that transmits a data signal Dm, and a driving voltage line 174 that transmits a driving voltage ELVDD may be connected to one pixel.

The first gate metal wire 151 or the second gate metal wire 152 may include the scan line 121, and the first data metal wire 171 or the second data metal wire 172 may include the data line 71 and the driving voltage line 174.

The driving transistor T1 includes a control terminal, an input terminal, and an output terminal, and the control terminal may be connected to the switching transistor T2, the input terminal may be connected to the driving voltage line 174, and the output terminal may be connected to the organic light emitting diode OLED. The driving transistor T1 may allow an output current Id, of which a magnitude may be changed according to a voltage applied between the control terminal and the output terminal, to flow.

The switching transistor T2 includes a control terminal, an input terminal, and an output terminal, and the control terminal may be connected to the scan line 121, the input terminal may be connected to the data line 71, and the output terminal may be connected to the driving transistor T1. The switching transistor T2 may transmit a data signal Dm applied to the data line 71 to the driving transistor T1 in response to the scan signal Dn applied to the scan line 121.

The compensation transistor T3 includes a control terminal, an input terminal, and an output terminal, and the control terminal may be connected to a compensation control line comp, the input terminal may be connected to an initialization voltage line 177, and the output terminal may be connected to the driving transistor T1.

The storage capacitor Cst may be connected between the control terminal of the driving transistor T1 and the initialization voltage line 177. The storage capacitor Cst may charge a data signal applied to the control terminal of the driving transistor T1 and maintain the data signal even after the switching transistor T2 is turned off.

The organic light emitting diode OLED may include an anode that is connected to the output terminal of the driving transistor T1 and a cathode that is connected to a common voltage ELVSS. The organic light emitting diode OLED may display emit light while changing the intensity thereof according to the output current Id of the driving transistor T1.

A connection relationship of the transistors T1, T2, and T3, the storage capacitor Cst, the parasitic capacitor Cpa, and the organic light emitting diode OLED may be changed.

In the example embodiment, the structure including the three transistors and the two capacitors is illustrated, but the present disclosure is not limited thereto, and the numbers of transistors and capacitors may be variously changed.

Hereinafter, a detailed structure of the pixel of the display device illustrated in FIG. 7 will be described with reference to FIG. 8.

Figure 8:
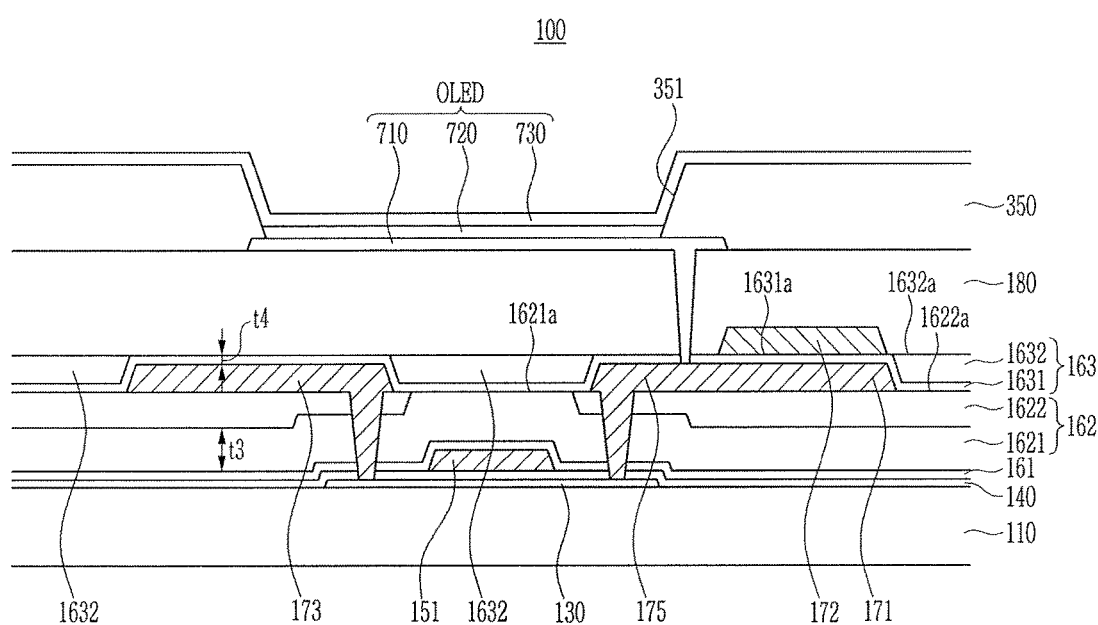
FIG. 8 illustrates a cross-sectional view of the display device according to an example embodiment.

FIG. 8 is a cross-sectional view of the display device according to the present example embodiment.

In the example embodiment shown in FIG. 8, an active layer 130 is disposed on a substrate 110 of the display device. The substrate 110 may be, for example, a flexible insulative substrate made of glass, quartz, ceramic, or plastic. The active layer 130 may include, for example, a polycrystalline silicon layer. A gate insulation layer 140 is disposed on the active layer 130. The first gate metal wire 151 is disposed on the gate insulation layer 140. A wire which is disposed while overlapping the active layer 130, in the first gate metal wire 151, may be a gate electrode.

A first insulation layer 161 covering the first gate metal wire 151 is disposed on the first gate metal wire 151. Although it is not illustrated in FIG. 8, a second gate metal wire 152 (refer to FIG. 5) may be disposed on the first insulation layer 161.

A second main insulation layer 1621 that covers the first insulation layer 161 is disposed on the first insulation layer 161. A second auxiliary insulation layer 1622 is disposed on the second main insulation layer 1621. The uppermost layer of the second main insulation layer 1621 includes a silicon nitride, and the second auxiliary insulation layer 1622 includes a silicon oxide.

An upper surface 1622*a* of the second auxiliary insulation layer 1622 is disposed on the same horizontal plane as a part of an upper surface 1621*a* of the second main insulation layer 1621. The upper surface 1622a of the second auxiliary insulation layer 1622 and the upper surface 1621a of the second main insulation layer 1621 are planarized with respect to each other. In addition, the first data metal wire 171 is disposed on a second insulation layer 162 that includes the second main insulation layer 1621 and the second auxiliary insulation layer 1622. As described, the second insulation layer 162 is planarized, and accordingly, the first data metal wire 171 that is disposed on the second insulation layer 162 may not have a step. The first data metal wire 171 may include the data line 71, a source electrode 173, or a drain electrode 175. The source electrode 173 and the drain electrode 175 are connected with the active layer 130.

In addition, a third main insulation layer 1631 that covers the first data metal wire 171 is disposed on the first data metal wire 171. A third auxiliary insulation layer 1632 is disposed on the third main insulation layer 1631. The third main insulation layer 1631 may include, for example, a silicon nitride and the third auxiliary insulation layer 1632 may include, for example, a silicon oxide.

An upper surface 1632a of the third auxiliary insulation layer 1632 is disposed on the same horizontal plane as an upper surface 1631a of the third main insulation layer 1631. The upper surface 1632a of the third auxiliary insulation layer 1632 and the upper surface 1631a of the third main insulation layer 1631 may be planarized with respect to each other. Further, a second data metal wire 172 is disposed on a third insulation layer 163 that includes the third main insulation layer 1631 and the third auxiliary insulation layer 1632. The third insulation layer 163 may be planarized, and the second data metal wire 172 that is disposed on the second insulation layer 162 may not have a step.

A part of the upper surface 1631a of the third main insulation layer 1631 that is disposed between the first data metal wire 171 and the second data metal wire 172 may directly contact the second data metal wire 172. Thus, capacitance of the parasitic capacitor Cpa that includes the first data metal wire 171, the second data metal wire 172, and the third main insulation layer 1631 that is disposed between the first data metal wire 171 and the second data metal wire 172 may be maximized. In addition, a thickness t4 of the third main insulation layer 1631 may be smaller than a thickness t3 of the second main insulation layer 1621. Accordingly, capacitance of the parasitic capacitor Cpa may be further maximized.

A passivation layer 180 is disposed on the second data metal wire 172. The passivation layer 180 may include, for example, an organic material, such as a polyacryl-based resin and a polyimide-based resin, a laminated layer of an organic material and an inorganic material, or the like.

A pixel electrode 710 is disposed on the passivation layer 180. The pixel electrode 710 may be formed of, for example, a transparent conductive material such as an indium tin oxide (ITO), an indium zinc oxide (IZO), a zinc oxide (ZnO), or an indium oxide (In2O3), or a reflective metal such as lithium (Li), calcium (Ca), fluorolithium/calcium (LiF/Ca), fluorolithium/aluminum (LiF/Al), aluminum (Al), silver (Ag), magnesium (Mg), or gold (Au). The pixel electrode 710 is electrically connected with the drain electrode 175.

A pixel defining layer 350 is disposed on the passivation layer 180 and an edge portion of the pixel electrode 710. The pixel defining layer 350 has an opening 351 that overlaps the pixel electrode 710. An organic emission layer 720 is disposed in the opening 351 of the pixel defining layer 350. The organic emission layer 720 may be formed of, for example, multiple layers including one or more of an emission layer, a hole injection layer HIL, a hole transport layer HTL, an electron transport layer ETL, and an electron injection layer EIL. The emission layer may be, for example, an organic material or an inorganic material. In the case where the organic emission layer 720 includes all of these layers, the hole injection layer may be disposed on the pixel electrode 710 that is an anode electrode, and the hole transport layer, the emission layer, the electron transport layer, and the electron injection layer may be sequentially laminated thereon.

A common electrode 730 is disposed on the pixel defining layer 350 and the organic emission layer 720. The common electrode 730 may be formed of, for example, a transparent conductive material such as an indium tin oxide (ITO), an indium zinc oxide (IZO), a zinc oxide (ZnO), or an indium oxide (In2O3), or a reflective metal such as lithium (Li), calcium (Ca), fluorolithium/calcium (LiF/Ca), fluorolithium/aluminum (LiF/Al), aluminum (Al), silver (Ag), magnesium (Mg), or gold (Au). The common electrode 730 may be a cathode electrode of the organic light emitting diode OLED. The pixel electrode 710, the organic emission layer 720, and the common electrode 730 may form the organic light emitting diode OLED.

By way of summation and review, the transistors and the capacitors may include a plurality of lines and an insulation layer. When resolution of a display device is increased, a size of a pixel may be decreased. In an ultra high-resolution display device, many wires may be disposed in a narrow space, so that an area having a large step between the wires within a pixel may be generated. In this case, when a photolithography process is performed, a pattern defect of the wire may be generated due to a pattern defect of a photosensitive film.

In addition, implementation of such an ultra high-resolution display device may call for an increase of capacitance of the capacitor. However, in order to increase the capacitance of the capacitor, a thickness of an insulation layer that is disposed between wires may be reduced, which may increase the possibility of a short circuit, and the occurrence of the short circuit may be increased in an area having a large step.

As described above, embodiments may provide a display device capable of implementing high resolution, and a method of manufacturing the same. According to example embodiments, a short circuit between data metal wires may be minimized, and sufficient capacitance may be assured. Further, a data metal wire may be easily patterned. Accordingly, the high resolution display device may be readily manufactured.

DESCRIPTION OF SYMBOLS

51: first slurry, 52: second slurry, 110: substrate, 130: active layer, 140: gate insulation layer, 151: first gate metal wire, 152: second gate metal wire, 161: first insulation layer, 1621: second main insulation layer, 1622: second main insulation layer, 163: third insulation layer, 1631: third main insulation layer, 1632: third auxiliary insulation layer, 171: first data metal wire, 172: second data metal wire.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a display device, the method comprising:
    forming a first gate metal wire on a substrate;
    forming a first insulation layer that covers the first gate metal wire;
    forming a second gate metal wire on the first insulation layer;
    forming a second main insulation layer that covers the second gate metal wire;
    forming a second auxiliary insulation layer on the second main insulation layer;
    forming an exposed portion of an upper surface of the second main insulation layer by polishing the second auxiliary insulation layer; and
    forming a first data metal wire on the second main insulation layer and the second auxiliary insulation layer, wherein:
    an upper surface of the second auxiliary insulation layer is formed on the same horizontal plane as the exposed portion of the upper surface of the second main insulation layer, and
    the uppermost layer of the second main insulation layer includes a silicon nitride, and the second auxiliary insulation layer includes a silicon oxide.

2. The method as claimed in claim 1, wherein:
    forming the exposed portion of the upper surface of the second main insulation layer by polishing the second auxiliary insulation layer includes coating a first slurry on a surface of the second auxiliary insulation layer, and
    the first slurry includes first abrasives that polish the second auxiliary insulation layer and includes a first polishing inhibitor that inhibits the polishing of the second main insulation layer.

3. The method as claimed in claim 1, wherein a thickness of the second auxiliary insulation layer is greater than a step of the upper surface of the second main insulation layer, the step of the upper surface of the second main insulation layer being a gap between a first portion of the upper surface of the second main insulation layer having a highest height and a second portion of the upper surface of the second main insulation layer having a lowest height.

4. The method as claimed in claim 1, further comprising:
    forming a third main insulation layer that covers the first data metal wire;
    forming a third auxiliary insulation layer on the third main insulation layer;
    forming an exposed portion of an upper surface of the third main insulation layer by polishing the third auxiliary insulation layer; and
    forming a second data metal wire on the third main insulation layer and the third auxiliary insulation layer, wherein:
    an upper surface of the third auxiliary insulation layer is disposed on the same horizontal plane as the exposed portion of the upper surface of the third main insulation layer.

5. The method as claimed in claim 4, wherein:
    the polishing of the third auxiliary insulation layer includes coating a second slurry on a surface of the third auxiliary insulation layer, and
    the second slurry includes second abrasives that polish the third auxiliary insulation layer and includes a second polishing inhibitor that inhibits the polishing of the third main insulation layer.

6. The method as claimed in claim 5, wherein the third main insulation layer includes a silicon nitride.

7. The method as claimed in claim 4, wherein a thickness of the third auxiliary insulation layer is greater than a step of the upper surface of the third main insulation layer, the step of the upper surface of the third main insulation layer being a gap between a third portion of the upper surface of the third main insulation layer having a highest height, and a fourth portion of the third main insulation layer having a lowest height.

8. The method as claimed in claim 1, wherein forming the exposed portion of the upper surface of the second main insulation layer includes polishing using a polishing device that includes:
    a polishing portion that polishes a target object while being rotated; and
    a polishing control portion that controls a rotation speed of the polishing portion by measuring a change in a frictional force of the polishing portion, and
    forming the exposed portion of the upper surface of the second main insulation layer by polishing the second auxiliary insulation layer includes:
    measuring the change in the frictional force of the polishing portion by sensing the rotation speed of the polishing portion by the polishing control portion; and
    stopping rotation of the polishing portion at the time that the frictional force is changed by the polishing control portion.

* * * * *